United States Patent [19]
Ayai et al.

[11] Patent Number: 5,891,585
[45] Date of Patent: Apr. 6, 1999

[54] NB₃AL MULTI-FILAMENTARY SUPERCONDUCTING WIRE

[75] Inventors: Naoki Ayai; Yuichi Yamada; Akira Mikumo; Kenichi Takahashi, all of Osaka; Norikiyo Koizumi, Naka-gun; Toshinari Ando, Naka-gun; Makoto Sugimoto, Naka-gun; Hiroshi Tsuji, Naka-gun, all of Japan

[73] Assignees: Sumitomo Elkectric Industries, Ltd.; Japan Atomic Energy Research Institute, both of Japan

[21] Appl. No.: 743,343

[22] Filed: Nov. 1, 1996

[30] Foreign Application Priority Data

Nov. 1, 1995 [JP] Japan ................................. 7-285012

[51] Int. Cl.⁶ .................................................. H01B 12/02
[52] U.S. Cl. ........................... 428/614; 428/662; 428/666; 428/674; 428/379; 428/930; 174/125.1; 505/806; 505/886; 505/887
[58] Field of Search .......................... 174/125.1; 29/599; 505/230, 231, 232, 236, 237, 431, 704, 806, 886, 887; 428/373, 374, 375, 379, 689, 930, 614, 662, 666, 674

[56] References Cited

U.S. PATENT DOCUMENTS

| | | | |
|---|---|---|---|
| 3,963,425 | 6/1976 | Sambrook . | |
| 4,052,784 | 10/1977 | Diepers et al. | 29/599 |
| 4,757,161 | 7/1988 | Wilhelm et al. | 174/126 S |
| 5,100,481 | 3/1992 | Nakayama et al. | 148/11.5 F |
| 5,189,386 | 2/1993 | Tada et al. | 335/216 |
| 5,364,709 | 11/1994 | Yu | 428/662 |

FOREIGN PATENT DOCUMENTS

| | | |
|---|---|---|
| 0 346 124 | 12/1989 | European Pat. Off. . |
| 0 405 405 | 1/1991 | European Pat. Off. . |

*Primary Examiner*—Marie Yamnitzky
*Attorney, Agent, or Firm*—Pennie & Edmonds LLP

[57] ABSTRACT

An $Nb_3Al$ multi-filamentary superconducting wire capable of realizing both stabilization of a superconducting state and increase in capacity is provided. The $Nb_3Al$ multi-filamentary superconducting wire includes a core formed of copper or copper alloy and located at the center of the wire; a multi-filamentary superconductor layer located around the core and having filaments containing Nb and Al as constituent elements embedded in a matrix formed of copper or copper alloy; and a high resistance layer located around the multi-filamentary superconductor layer, and is characterized in that a sectional area of the core is at least 15% of the total sectional area of the core and the matrix and that the core and the matrix are formed of copper or copper alloy of at least 99.9% purity.

2 Claims, 3 Drawing Sheets

NB$_3$AL MULTI-FILAMENTARY SUPERCONDUCTING WIRE

BACKGROUND OF THE INVENTION

1. Field of the Invention

The present invention relates to an Nb$_3$Al multi-filamentary superconducting wire, and more particularly, to a compound superconducting wire serving as high magnetic field superconducting materials for superconducting magnets which can be used for nuclear fusion, superconducting energy storage or the like.

2. Description of the Background Art

A wire using compound superconductors is used as means attaining a high magnetic field which cannot be obtained with a wire using alloy superconductors such as NbTi. Among this compound superconductors, Nb$_3$Al particularly has a higher critical magnetic field of 30 T at 4.2K and superior distortion resistance characteristics. Nb$_3$Al is therefore expected as a high magnetic field superconducting material of the next generation.

Since Nb$_3$Al has poor ductility and cannot be directly worked like other compound superconductors, a wire is prepared by working a composite body including Nb, Al and a supplementary stabilizing material of copper or copper alloy into a wire having a final shape and thereafter producing Nb$_3$Al by diffusion reaction by heat treatment. Various methods of working a composite body into a wire such as a jelly roll method, a powder metallurgy method and a tube method have been developed according to Nb/Al composite forms.

Application of Nb$_3$Al to superconducting energy storage and nuclear fusion generating high electromagnetic force has been considered promising, taking advantage of its excellent distortion resistance characteristics.

Then, stabilization of a superconducting state and increase in capacity are required for a superconducting wire used for nuclear fusion and superconducting energy storage.

First, stabilization of a superconducting state of a superconducting wire requires a high residual resistance ratio, and in a nuclear fusion reactor, for example, requires a residual resistance ratio of at least 100. Thus, copper of high purity having a high residual resistance ratio has been used as matrix having filaments of superconductors embedded therein.

On the other hand, increase in capacity requires a multiple-stranded wire structure with at least several hundreds of strands. In such a multiple-stranded wire structure, however, a strand pitch is increased, whereby loss resulting from electromagnetic coupling between strands is increased. Then, in order to solve such a problem, a high resistance layer such as chromium has been provided at a surface of a wire in the case of a compound superconducting wire such as Nb$_3$Sn.

In order to realize both stabilization of a superconducting state and increase in capacity of an Nb$_3$Al multi-filamentary superconducting wire, we prepared a superconducting wire by combining the above-mentioned conventional examples to form a multiple-stranded wire structure using copper of high purity as a matrix and thereafter providing a high resistance layer thereon, but the following problems occurred.

More specifically, in preparation of an Nb$_3$Al multi-filamentary superconducting wire, heat treatment at a high temperature of at least 700° C. is usually carried out for production of Nb$_3$Al. Consequently, in this heat treatment, elements contained in a high resistance layer such as chromium are diffused into a matrix of copper or copper alloy, causing reduction in residual resistance ratio.

SUMMARY OF THE INVENTION

It is an object of the present invention to provide an Nb$_3$Al multi-filamentary superconducting wire capable of solving the above-mentioned problems and of realizing both stabilization of a superconducting state and increase in capacity.

More specifically, it is an object of the present invention to provide an Nb$_3$Al multi-filamentary superconducting wire having both a residual resistance ratio of at least 100 and high stability and causing small loss due to coupling between superconducting wires even when being stranded.

As a result of our study to achieve the above-described objects, we found that a residual resistance ratio in an Nb$_3$Al multi-filamentary superconducting wire having a high resistance layer has a close relation with (1) a ratio of a core to a matrix and with (2) copper purity of the core and the matrix.

In other words, an Nb$_3$Al multi-filamentary superconducting wire according to one aspect of the present invention is provided. This Nb$_3$Al multi-filamentary superconducting wire includes a core formed of copper or copper alloy and located in the center of the wire; a multi-filamentary superconductor layer located around the core and having filaments containing Nb and Al as constituent elements embedded in a matrix of copper or copper alloy; and a high resistance layer located around the multi-filamentary superconductor layer, and is characterized in that a sectional area of the core is at least 15% of the total sectional area of the core and the matrix and that the core and the matrix are made of copper or copper alloy of at least 99.9% purity.

The sectional area of the core is preferably at least 20% of the total sectional area of the core and the matrix.

Furthermore, the high resistance layer is preferably made of chromium.

An Nb$_3$Al multi-filamentary superconducting wire according to the present invention includes a core of copper or copper alloy. This core contributes to stabilization of the entire superconducting wire.

Furthermore, an Nb$_3$Al multi-filamentary superconducting wire according to the present invention includes a high resistance layer. This high resistance layer prevents occurrence of electromagnetic coupling between superconducting wires when being stranded, and therefore serves to reduce coupling loss.

In addition, according to the present invention, a sectional area of a core is at least 15% of the total sectional area of the core and a matrix. Consequently, even if elements contained in a high resistance layer are diffused into the matrix by heat treatment for production of Nb$_3$Al, a residual resistance ratio of the entire superconducting wire is assured by the core which is not subjected to contamination, achieving sufficient stability for practical use.

Further, according to the present invention, a core and a matrix are made of copper or copper alloy of at least 99.9% purity. Consequently, impurities and added elements contained in the matrix are prevented from being diffused into the core by heat treatment for production of Nb$_3$Al, assuring stability of the entire superconducting wire.

Moreover, according to the present invention, chromium is preferably used as high resistance layer. This is because solubility of chromium in solid copper is small and therefore the amount of reduction in residual resistance ratio is relatively small.

As has been described above, according to the present invention, an Nb$_3$Al multi-filamentary superconducting wire capable of realizing both stabilization of a superconducting state and increase in capacity can be obtained.

More specifically, according to the present invention, a superconducting wire having both a residual resistance ratio of at least 100 and high stability and causing small loss due to coupling between superconducting wires even when being stranded. Consequently, an Nb$_3$Al multi-filamentary superconducting wire according to the present invention can be used as a superconductor wire in a nuclear fusion reactor, for example.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

EXAMPLE 1

Figure 1:
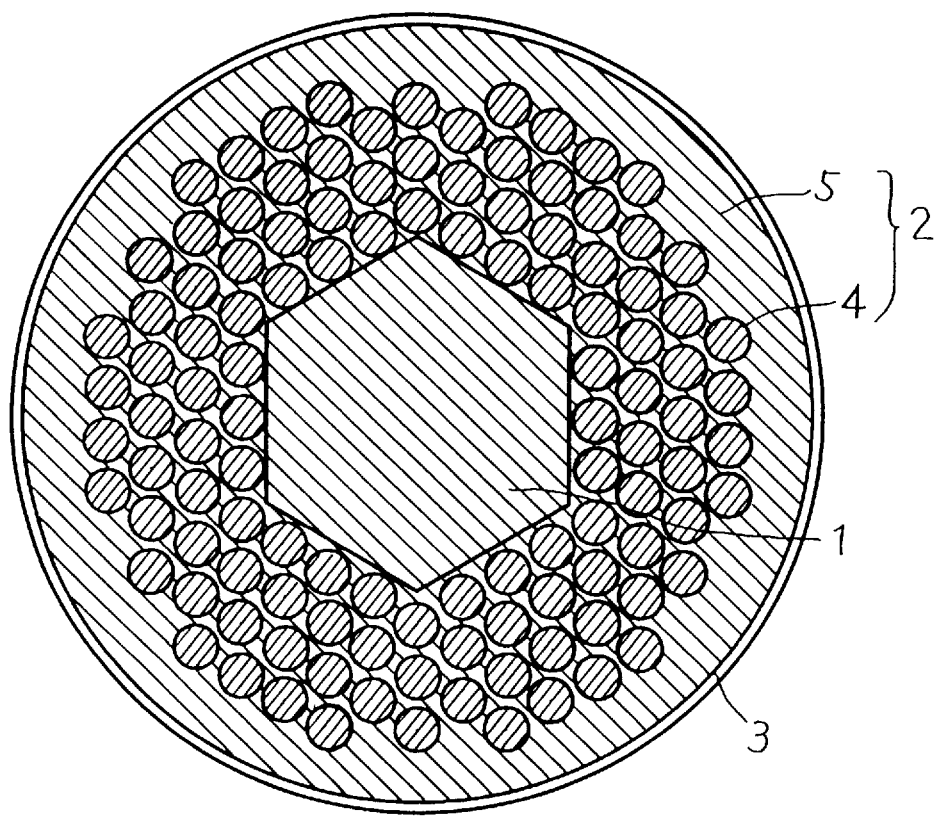
FIG. 1 is a cross sectional view showing a structure of one example of an Nb$_3$Al multi-filamentary superconducting wire according to the present invention.

FIG. 1 is a cross sectional view showing a structure of one example of an Nb$_3$Al multi-filamentary superconducting wire according to the present invention.

Referring to FIG. 1, this Nb$_3$Al multi-filamentary superconducting wire is constituted by a core 1 formed of oxygen free copper of at least 99.95% purity and having a diameter of 0.81 mm, a multi-filamentary superconductor layer 2 located around core 1, and a high resistance layer 3 formed of chromium with a thickness of 2 $\mu$m and located around multi-filamentary superconductor layer 2.

Multi-filamentary superconductor layer 2 has superconducting filaments 4 embedded in a matrix 5 formed of oxygen free copper of at least 99.95% purity, wherein the ratio of the total sectional area of matrix 5 and the above-mentioned core 1 to a sectional area of the superconducting filaments was 1.5. This ratio is hereinafter referred to as "a copper ratio".

For an Nb$_3$Al multi-filamentary superconducting wire structured as such, five kinds of Nb$_3$Al multi-filamentary wires having different ratios of a sectional area of core 1 to the total sectional area of core 1 and matrix 5 of 31%, 22%, 16%, 11% and 1%, respectively, were prepared. This ratio is hereinafter referred to as "a core ratio".

Note that definition of the terms "copper ratio" and "core ratio" will be given in the following for clarification.

(Copper ratio)={(sectional area of core)+(sectional area of matrix)}/(sectional area of superconducting filaments)

(Core ratio) %=[(sectional area of core)/{(sectional area of core)+(sectional area of matrix)}]×100.

Next, the prepared five kinds of Nb$_3$Al multi-filamentary wires were subjected to heat treatment at 750° C. for 50 hours for production of Nb$_3$Al, and thus five kinds of Nb$_3$Al multi-filamentary superconducting wires were prepared.

A residual resistance ratio was measured for thus prepared superconducting wires. The result is shown in the Table 1 and FIG. 2 in the following.

TABLE 1

| | Residual Resistance Ratio | | |
|---|---|---|---|
| Core Ratio | Heat Treatment for 50 hours | Heat Treatment for 80 hours | Heat Treatment for 100 hours |
| 31% | 159 | 137 | 136 |
| 22% | 140 | 122 | 108 |
| 16% | 112 | 90 | 80 |
| 11% | 82 | 68 | 55 |
| 1% | 39 | 24 | 19 |

Figure 2:
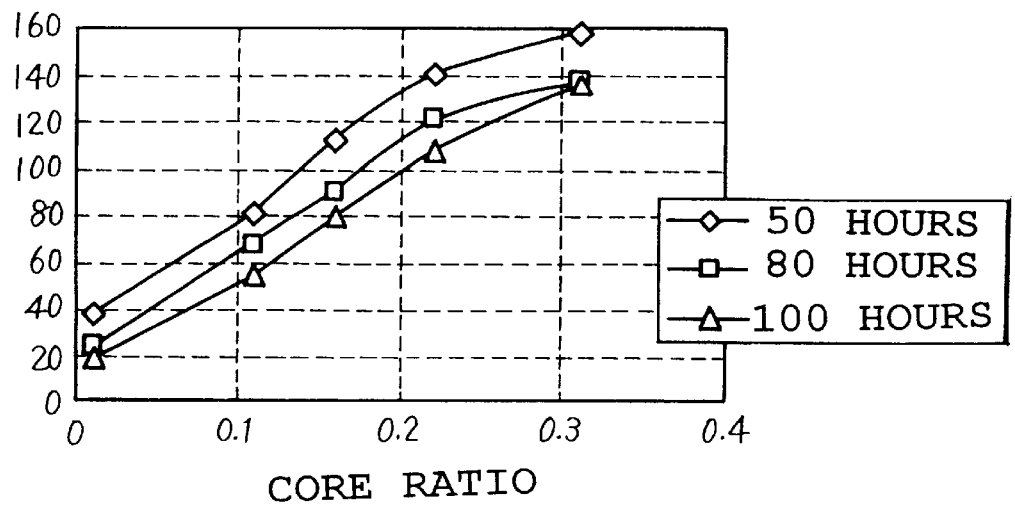
FIG. 2 is a graph illustrating the relation between a core ratio and a residual resistance ratio in an Example 1.

It was found from the Table 1 and FIG. 2 that a core ratio of at least 15% is required for heat treatment of at most 50 hours in order to achieve a residual resistance ratio of at least 100. On the other hand, it was also found that a core ratio of at least 20% is required for heat treatment for at least 80 hours.

Note that, in preparing an Nb$_3$Al multi-filamentary superconducting wire, heat treatment conditions must be set taking into account not only optimization of a residual resistance ratio but also optimization of other characteristics, in particular, of critical current density which is the most important characteristics for a superconducting wire. When an element having large heat capacity such as large coil is subjected to heat treatment, time required for rising or falling in temperature in some portions of the element is different from that in other portions thereof. More specifically, if such heat treatment conditions are set that a portion which is less likely to be heated in the element is subjected to fixed heat treatment, a portion which is likely to be heated in the element will be subjected to heat treatment excessively. Therefore, particularly in preparing a large coil or the like, it is desirable to set heat treatment conditions so that high characteristics of at least prescribed level may be maintained even for those portions which do not satisfy the set conditions, taking possible variation into consideration.

Figure 3:
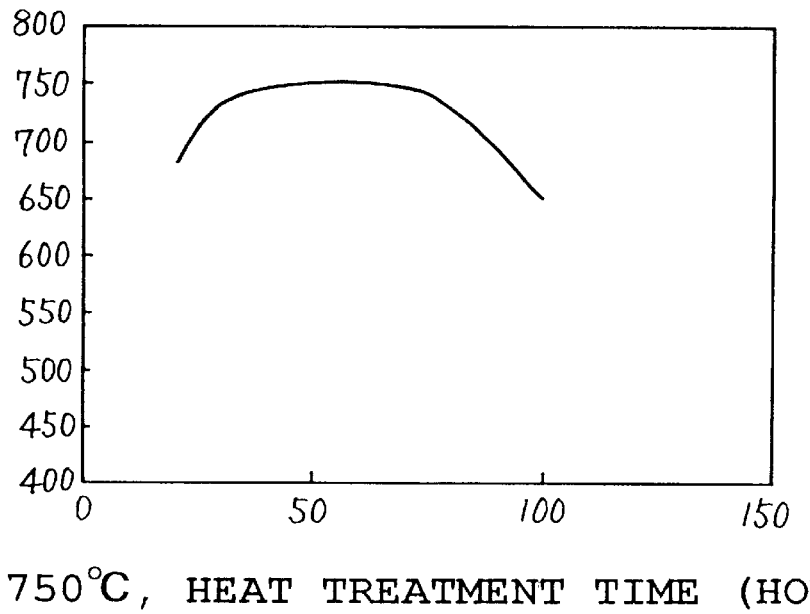
FIG. 3 is a graph illustrating the relation between heat treatment time and critical current density in the Example 1.

FIG. 3 is a graph showing the relation between heat treatment time and resultant critical current density for the Nb$_3$Al multi-filamentary superconducting wires obtained in the Example 1. Note that the abscissa indicates heat treatment time (hour) at 750° C. and the ordinate indicates critical current density Jc (A/mm$^2$) with 12 T. Referring to FIG. 3, the critical current density has its maximum value which is almost constant over the wide range of heat treatment time. On the other hand, the residual resistance ratio shown in FIG. 2 increases uniformly with increase in heat treatment time.

From the foregoing, in order to assure both a residual resistance ratio of at least 100 and high critical current density of at least fixed value in preparing a large coil or the like, a core ratio of at least 20% is desirable taking into consideration some portions of the coil being actually subjected to heat treatment for a time period longer than a set value.

EXAMPLE 2

Figure 4:
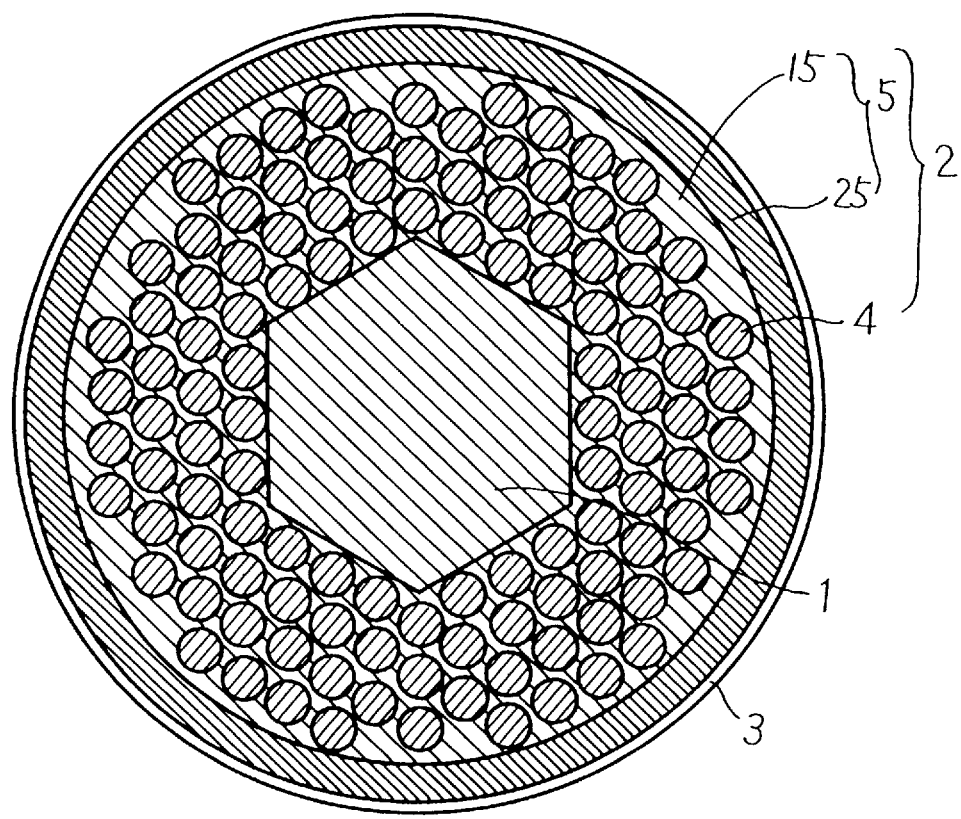
FIG. 4 is a cross sectional view showing a structure of another example of an Nb$_3$Al multi-filamentary superconducting wire according to the present invention.

FIG. 4 is a cross sectional view showing a structure of another example of an Nb$_3$Al multi-filamentary superconducting wire according to the present invention.

Referring to FIG. 4, this Nb$_3$Al multi-filamentary superconducting wire is different from that shown in FIG. 1 in structure of multi-filamentary superconductor layer 2. More specifically, in the present example, a multi-filamentary superconductor layer 2 is constituted by an inner peripheral matrix 15 having superconducting filaments 4 embedded therein and formed of oxygen free copper of at least 99.95% purity, and an outer peripheral matrix 25 located around inner peripheral matrix 15.

Note that the $Nb_3Al$ multi-filamentary superconducting wire in the present example is otherwise the same as that of FIG. 1, description thereof will not be repeated herein.

For the $Nb_3Al$ multi-filamentary superconducting wire structured as such, three kinds of $Nb_3Al$ multi-filamentary wires were prepared using oxygen free copper of at least 99.95% purity, phosphorus-deoxidized copper of at least 99.95% purity, and silver-containing copper of 99.8% as outer peripheral matrix 25, respectively.

Next, the prepared three kinds of $Nb_3Al$ multi-filamentary wires were subjected to heat treatment at 750° C. for 50 hours for production of $Nb_3Al$ as in the case of the Example 1, whereby three kinds of $Nb_3Al$ multi-filamentary superconducting wires were prepared.

A residual resistance ratio was measured for thus prepared superconducting wires. The result is shown in the Table 2 in the following.

TABLE 2

| Core Ratio | 31% | 31% | 31% |
| --- | --- | --- | --- |
| outer peripheral matrix (Cu purity) | oxygen free copper (at least 99.95%) | phosphorus-deoxidized copper (at least 99.9%) | silver-containing copper (99.8%) |
| residual resistance ratio | 159 | 132 | 95 |

As can be seen from the Table 2, a residual resistance ratio was at most 100 even when only a portion of the matrix is formed of Cu alloy of purity less than 99.9%. Consequently, it was found that not only the core but also the entire matrix must be formed of copper or copper alloy of at least 99.9% purity in order to achieve a residual resistance ratio of at least 100.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An $Nb_3Al$ multi-filamentary superconducting wire, comprising:

a core comprised of copper or copper alloy and located at a center of the wire; and a multi-filamentary superconductor layer located around said core and having filaments containing Nb and Al as constituent elements embedded in a matrix comprised of copper or copper alloy, characterized in that a sectional area of said core is at least 20% of a total sectional area of said core and said matrix, and said core and said matrix are comprised of copper or copper alloy of at least 99.9% purity.

2. The $Nb_3Al$ multi-filamentary superconducting wire as recited in claim 1, further comprising a chromium layer located around said multi-filamentary superconductor layer.

* * * * *